United States Patent
Nagai et al.

[11] Patent Number: 5,876,496
[45] Date of Patent: Mar. 2, 1999

[54] METHOD FOR FEEDING A GRANULAR RAW MATERIAL AND FEEDING APPARATUS

[75] Inventors: Naoki Nagai; Chihiro Tashiro; Atsushi Ozaki; Michiaki Oda, all of Annaka, Japan

[73] Assignee: Shin-Etsu Handotai Co., Ltd., Tokyo, Japan

[21] Appl. No.: 827,105

[22] Filed: Mar. 17, 1997

[30] Foreign Application Priority Data

Mar. 21, 1996 [JP] Japan ................................ 8-091895

[51] Int. Cl.⁶ .................................................... C30B 15/02
[52] U.S. Cl. .............................. 117/33; 117/214; 117/216
[58] Field of Search ................................ 117/33, 214, 216

[56] References Cited

U.S. PATENT DOCUMENTS

| | | | |
|---|---|---|---|
| Re. 35,242 | 5/1996 | Kajimoto et al. | 117/33 |
| 3,998,686 | 12/1976 | Meiling et al. | 117/33 |
| 5,229,082 | 7/1993 | Seidensticker | 117/214 |
| 5,324,488 | 6/1994 | Klingshirn et al. | 117/214 |

FOREIGN PATENT DOCUMENTS 03271188  12/1991  Japan ........................................ 117/33

*Primary Examiner*—Robert Kunemund
*Attorney, Agent, or Firm*—Ronald R. Snider

[57] ABSTRACT

A feeding reservoir 11 for intermittently or continuously feeding granular raw material into a pulling apparatus 1, a chamber 13 connected to the feeding reservoir 11 through a gate valve 12, a granular raw material supply section 15 by which the granular raw material is supplied to the chamber 13 through a gate valve 14 and a pressure adjustment means 20 which adjusts the inner pressure of the chamber 13 is provided, and the granular raw material is fed to the feeding reservoir 11 while maintaining the inner pressure of the feeding reservoir 11 as the same as the inner pressure of the single crystal pulling apparatus 1. This feeding method and structure makes it possible to feed an additional amount of granular raw material even during the continuous charging process and or the recharging process without interrupting the process and also to pull a heavy single crystal rod with a large diameter without increasing the capacity of the feeding reservoir.

7 Claims, 5 Drawing Sheets

METHOD FOR FEEDING A GRANULAR RAW MATERIAL AND FEEDING APPARATUS

RELATED APPLICATION

This application claims the priority of Japanese Patent application No.8-91895 filed on Mar. 21, 1996, which is incorporeted herein by reference.

BACKGROUND OF THE INVENTION

1. Field of the Invention

This invention relates in general to a method and an apparatus for growing a single crystal according to the Czochralski method, and more particularly to a method and an apparatus for feeding the granular raw material.

2. The prior Art

When manufacturing a silicon single crystal according to the Czochralski method, the granular raw material, i.e. silicon poylcrystals, which is the raw material for the single crystal is put into a crucible and heated above the melting point of silicon to obtain a melt. A seed crystal is then dipped in the melt, and then pulled upwardly to grow a single crystal rod. The amount of the melt in the crucible decreases as the pulling process progresses, so that it is required to make up for the decrease of the melt by feeding the granular raw material to the crucible. An apparatus which have a granular raw material feeding pipe is used for feeding the granular raw material.

One of these methods for feeding the granular raw material using such an apparatus is so-called continuous charging method in which the granular raw material is continuously feeded onto the surface of the melt in the crucible while the single crystal is grown. FIG. 4 shows an example of the configuration of the single crystal pulling apparatus and the granular raw material feeder used for growing a single crystal according to the continuous charging method. In FIG. 4, the single crystal pulling apparatus 21 has a crucible which is not shown, and the granular raw material is fed into the crucible from the granular raw material feeder 30, whose configuration is enclosed by dotted lines.

The granular raw material feeder 30 comprises a feeding reservoir 32 which is connected to the single crystal pulling apparatus 21 through a gate valve 31, a gas feeding section 35 which is interconnected to the feeding reservoir 32 through a valve 34 and supplies argon and such, and a vacuum pump 36 which is interconnected to the feeding reservoir 32 through a valve 33. The feeding reservoir 32 has a granular raw material supplying section 38 by which the granular raw material is supplied through a valve (or an opening which can be sealed) 37. The pressure in the feeding reservoir 32 is always kept at the same pressure as the inner pressure of the single crystal pulling apparatus 21 (typically 10–1,000 hPa) and it is possible to feed the granular raw material into the single crystal pulling apparatus 21 through the gate valve 31 while the single crystal is being pulled. The valves 33, 34 and 37, or all valves except the gate valve 31, are closed during feeding.

For supplying the granular raw material to the feeding reservoir 32 when the inner pressure of the single crystal pulling apparatus 21 is reduced, the gate valve 31 is closed firstly, then the valve 37 is then opened to restore the inner pressure of the feeding reservoir 32 back to the atmospheric pressure. Then the feeding reservoir 32 is removed, and the granular raw material is directly supplied to the feeding reservoir 32 through the granular raw material supplying section (loading port) 38. An alternative method involves setting up a drum can containing the raw material or an intermediate feeding reservoir on top of the feeding reservoir 32, connecting it to the granular raw material supplying section 38 and then pouring the granular raw material through the valve 37.

After supplying the granular raw material, the feeding reservoir 32 is replaced if it has been removed, the valves 34 and 37 are closed, then the valve 33 is opened with the vacuum pump 36 running to establish a vacuum in the feeding reservoir 32, and then the valve 33 is closed. Then the valve 34 is opened to supply argon from the gas feeding section 35 into the feeding reservoir 32 so that the inside of the feeding reservoir 32 is filled with argon gas whose pressure is the same as the pressure in the single crystal pulling apparatus 21. Then the valve 34 and the gate valve 31 are closed one by one. By the processes shown above, it is possible to feed the granular raw material into the single crystal pulling apparatus 21.

The continuous charging method as described above makes it possible to grow a longer single crystal rod limited by the capacity of the feeding reservoir, and therefore allows a substantial improvement in the manufacturing yield and a drastic reduction of the manufacturing cost.

In addition to the continuous charging method described above, the multiple-pulling method, a version of the conventional batch process, is also known as a method of reducing the manufacturing cost (refer to Semiconductor Silicon Crystal Technology, Fumino Shimura, pp178–179, 1989). In this method, after pulling a single crystal with a dopant concentration in the range which satisfies prescribed resistivity standards, additional charging (hereafter referred to as recharging) of the granular raw material in the amount equal to the weight of the grown single crystal rod is carried out by the batch process, and another rod of single crystal is pulled again. By this way, a plurality of single crystal rods can be manufactured from the melt once loaded. Therefore this method makes it possible to improve the manufacturing yield and reduce cost for the crucible. In this multiple-pulling method, the granular raw material is also fed from the feeding reservoir while recharging is being carried out.

In the conventional method for feeding granular raw material as described above, continuous charging and recharging of the granular raw material is impossible while feeding the granular raw material into the feeding reservoir during the pulling process, in which the gate valve between the feeding reservoir and the single crystal pulling apparatus is closed, as described before, and the inner pressure of the feeding reservoir is restored to the atmospheric pressure before feeding the granular raw material. Therefore it results in poor efficiency.

BRIEF SUMMARY OF THE INVENTION

The object of the present invention is to provide a method and an apparatus which make it possible to carry out the pulling process according to the continuous charging method and or the recharging process with the multiple-pulling method and simultaneously feed the granular raw material into the feeding reservoir without interrupting these processes.

The invention in one aspect provides a method for feeding granular raw material to a single crystal pulling apparatus from a feeding reservoir connected with a chamber with the feeding reservoir through a gate valve, comprising the steps of unsealing the chamber to set the inner pressure of the chamber at the atmospheric pressure with keeping the gate valve closed; feeding the granular raw material into the chamber; sealing the chamber; adjusting the chamber to be at the same pressure as that of the single crystal pulling apparatus by supplying the chamber with a gas; opening the gate valve; and supplying the granular raw material to the feeding reservoir; wherein the inner pressure of the feeding reservoir is maintained at the same pressure as the inner pressure of the pulling apparatus at any time during the above steps, The invention in another aspect provides a granular raw material feeder for a single crystal pulling apparatus, comprising a feeding reservoir for feeding granular raw material to the s ingle crystal pulling apparatus intermittently or continuously; a chamber which is connected with the feeding reservoir through a first gate valve; a granular raw material supply section by which the granular raw material is supplied to the chamber through a second gate valve; and a pressure adjustment means for adjusting the inner pressure of the chamber; wherein the granular raw material is supplied to the feeding reservoir while the inner pressure of the feeding reservoir is maintained at the same pressure as the inner pressure of the single crystal pulling apparatus.

In the granular raw material feeder, the pressure adjustment means may comprise a pressure reduction means for reducing the inner pressure of the chamber through a valve; and a gas feeding means by which gas is supplied at desired pressure through a valve into the chamber. A granular raw material storage facility may be connected to the granular raw material supply section through direct piping, or a granular raw material manufacturing facility may be connected to the granular raw material supply section through direct piping.

EMBODIMENTS

Embodiments of the present invention are described below.

Figure 1:
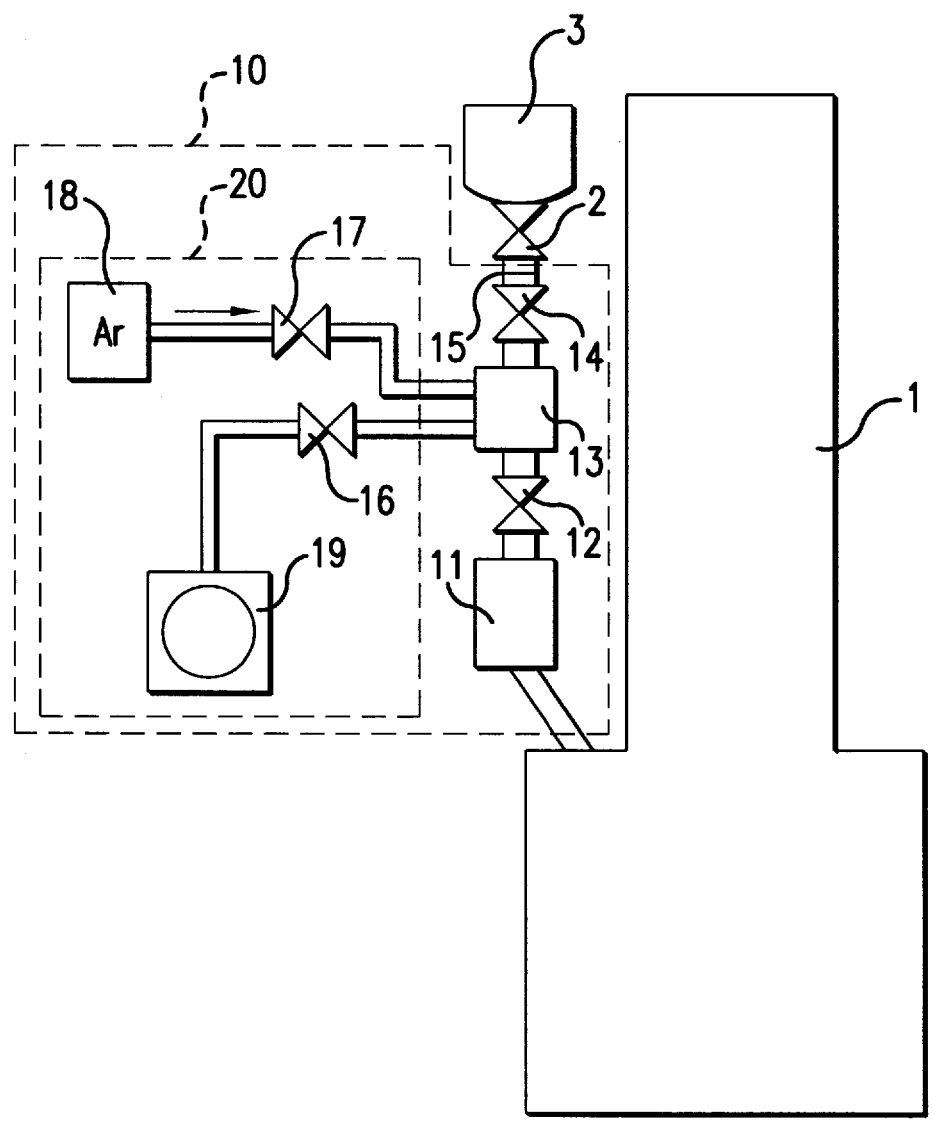
FIG. 1 is a configuration diagram showing an embodiment of the granular raw material feeder according to the present invention.

FIG. 1 shows an embodiment of the present invention. In FIG. 1, the granular raw material is fed into the single crystal pulling apparatus 1 from the granular raw material feeder 10 configured as shown in the area enclosed by dotted lines.

The granular raw material feeder 10 comprises a feeding reservoir 11 which is interconnected to a single crystal pulling apparatus 1 and stores the granular raw material, a chamber 13 which is interconnected to the feeding reservoir 11 through a gate valve 12 and a pressure adjustment means 20 which is configured as shown in the area enclosed by dotted lines. The chamber 13 has a granular raw material supply section 15 which supplies the granular raw material from outside through a gate valve 14.

The pressure adjustment means 20 comprises a gas feeding section 18 which is interconnected with the chamber 13 through a valve 17 and supplies argon and such, and a vacuum pump 19 which is inerconnected with the chamber 13 through a valve 16.

The inner pressure of the feeding reservoir 11 is always maintained to be the same as the inner pressure of the single crystal pulling apparatus 1, and it can feed the granular raw material into the single crystal pulling apparatus 1 during the pulling process. Before feeding the additional granular raw material to the feeding reservoir 11, the following operations are carried out. At first, the gate valve 12 is closed and the gate valve 14 is then opened with the valves 16 and 17 closed to restore the inner pressure of the chamber 13 back to the atmospheric pressure. After this, a drum can 3 with a valve 2 for example, which contains the granular raw material, is moved over to and attached to a granular raw material supplying section 15, and the granular raw material is poured into the chamber 13 through the valve 2 and the gate valve 14.

After pouring a required amount of the granular raw material into the chamber 13, the gate valve 14 is closed, the valve 16 is opened, the vacuum pump 19 runs and restores a vacuuum inside of the chamber 13, and then the valve 16 is closed. The valve 17 is then opened to introduce argon from the gas feeding section 18. When the inner pressure of the chamber 13 becomes the same as the inner pressure of the feeding reservoir 11, the valve 17 is closed. The gate valve 12 is then opened to feed the additional granular raw material from the chamber 13 into the feeding reservoir 11.

By carrying out the series of operations described above, it is possible to feed the granular raw material to the feeding reservoir while the single crystal pulling apparatus is receiving a continuous feeding of the granular raw material according to the continuous charging method or while recharging is being carried out according to the multiple-pulling method.

In the feeding method described above, when feeding the granular raw material, the drum can 3 containing the granular raw material is moved over to the granular raw material supplying section 15 and attached. However, fine dust rises when the granular raw material is poured from the drum can 3 into the chamber 13, and this could have an adverse effect on the operator and the surrounding environment. There is also a problem in that the granular raw material which is required to be highly pure has more surface area per weight compared with conventional chunk polycrystals and this increases the chance of contamination by resins and or heavy metals and also by gas adsorption when it is poured into the chamber 13.

Figure 2:
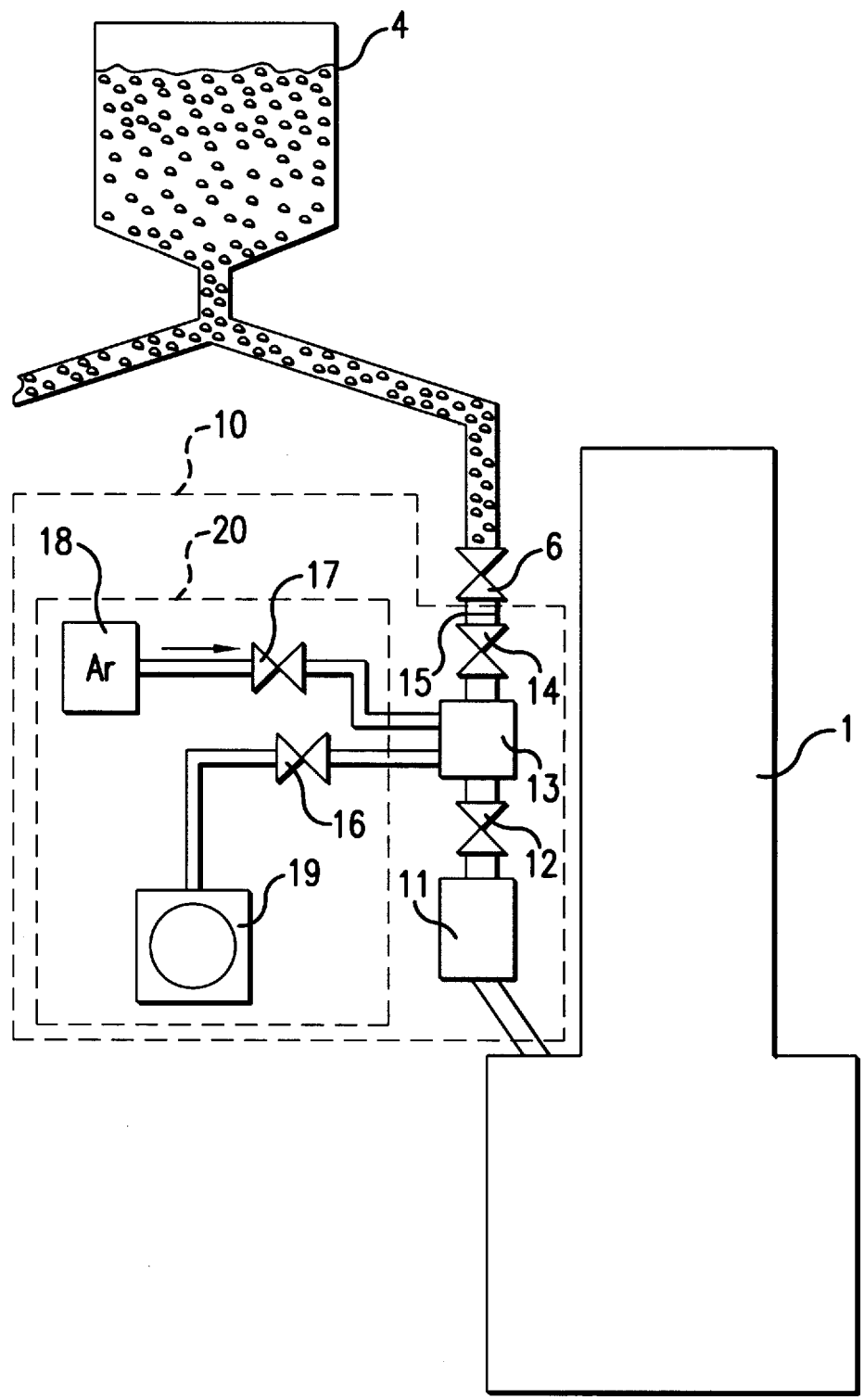
FIG. 2 is a configuration diagram showing an example of a connection between a granular raw material storage facility and the granular raw material feeder of FIG. 1.
Figure 3:
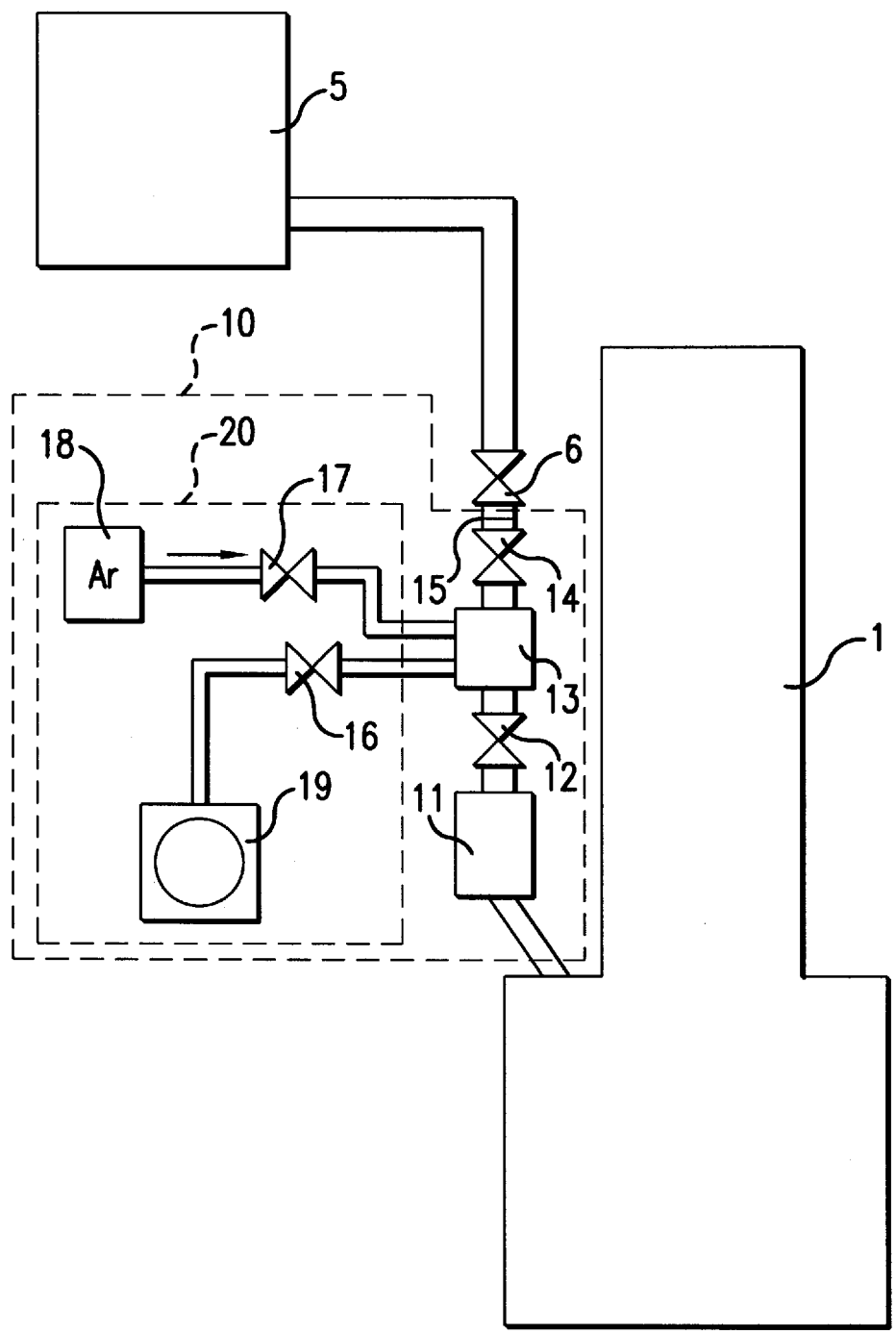
FIG. 3 is a configuration diagram showing an example of a connection between a granular raw material manufacturing facility and the granular raw material feeder of FIG. 1.
Figure 4:
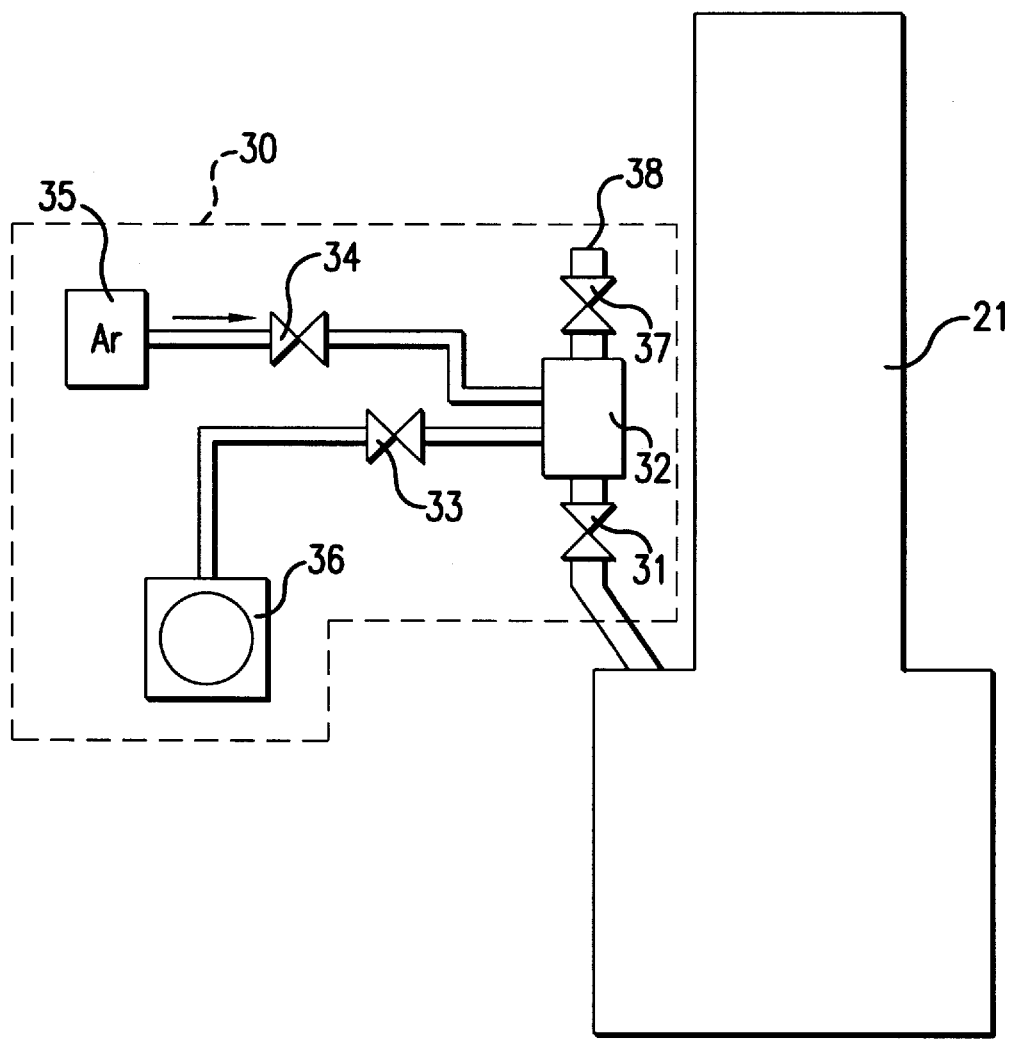
FIG. 4 is a configuration diagram showing the pulling apparatus and the granular raw material feeder used when manufacturing a single crystal according to the continuous charging method.
Figure 5:
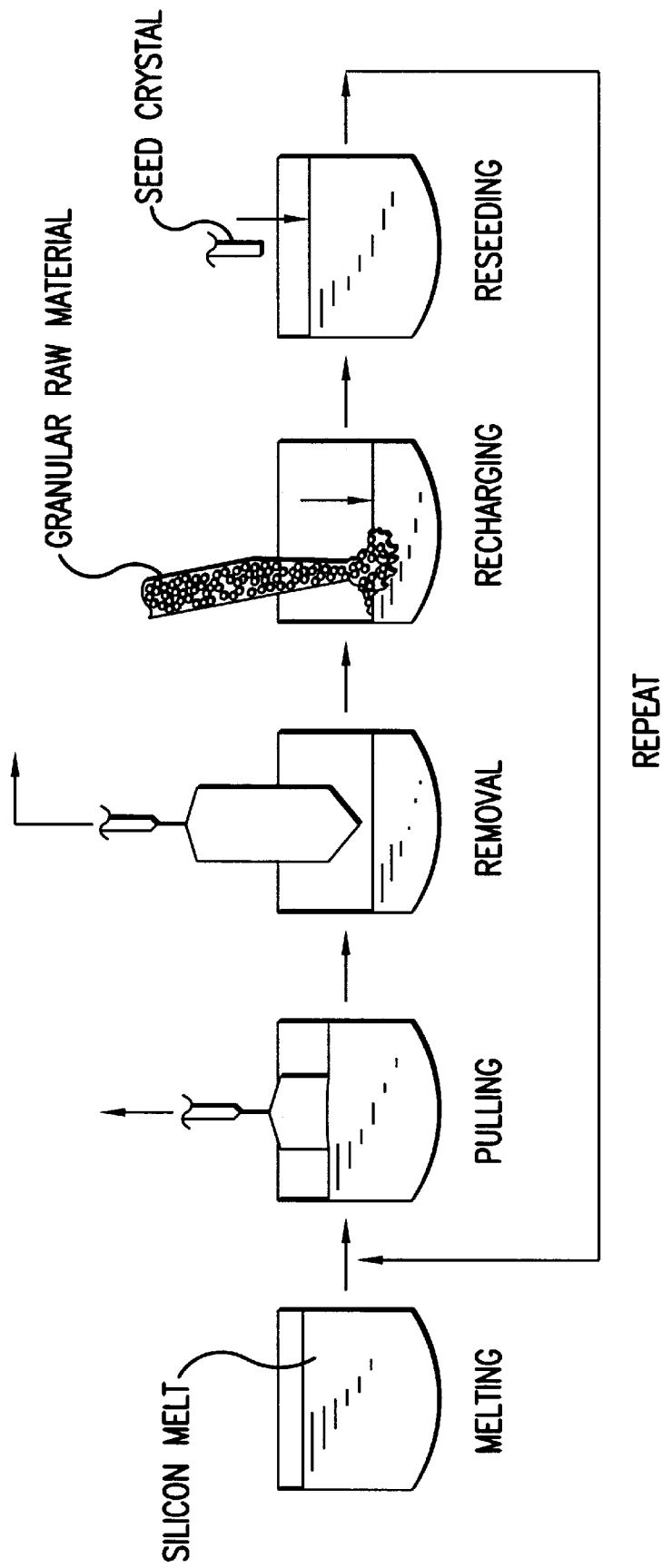
FIG. 5 is a process diagram showing the multiple-pulling method.

To avoid such problems described above, instead of moving and attaching the drum can 3 every time the granular raw material is feeded, it is also possible to connect a granular raw material storage facility 4 or a granular raw material manufacturing facility 5 to the granular raw material supplying section 15 through a valve 6 by means of direct piping, as shown in FIGS. 2 or 3. These configurations can prevent unwanted gas adsorption and or contamination during transportation of the granular raw material as well as the environmental contamination of surrounding areas caused by dust rising when pouring the granular raw material.

The granular raw material feeding method and apparatus according to the present invention make it possible to feed an additional amount of granular raw material even during the continuous charging process and or the recharging process without interrupting the process and also to pull a heavy single crystal rod with a large diameter without increasing the capacity of the feeding reservoir. Also, if a direct piping connection with a granular raw material storage facility or a granular raw material manufacturing facility is arranged, then contamination of the granular raw material can be prevented to manufacture a high quality single crystal, and environmental contamination in areas surrounding the pulling apparatus caused by dust rising can also be prevented.

What is claimed is:

1. A method for feeding granular raw material to a single crystal pulling apparatus from a feeding reservoir connected with a chamber through a first gate valve, comprising the steps of:

unsealing said chamber by opening a second gate valve provided on said chamber to set the inner pressure of said chamber at the atmospheric pressure while keeping said first gate valve closed;

feeding the granular raw material into said chamber through said second gate valve;

sealing said chamber by closing said second gate valve;

adjusting said chamber to be at the same pressure as that of said single crystal pulling apparatus by supplying said chamber with a gas;

opening said first gate valve; and supplying the granular raw material to said feeding reservoir;

wherein the inner pressure of said feeding reservoir is maintained at the same pressure as the inner pressure of said pulling apparatus at any time during the above steps.

2. A granular raw material feeder for a single crystal pulling apparatus, comprising:

a feeding reservoir for feeding granular raw material to said single crystal pulling apparatus intermittently or continuously;

a chamber which is connected with said feeding reservoir through a first gate valve;

a granular raw material supply section by which the granular raw material is supplied to said chamber through a second gate valve; and a pressure adjustment means for adjusting the inner pressure of said chamber;

wherein the granular raw material is supplied to said feeding reservoir while the inner pressure of said feeding reservoir is maintained at the same pressure as the inner pressure of said single crystal pulling apparatus.

3. A granular raw material feeder of claim 2 wherein said pressure adjustment means comprises:

a pressure reduction means for reducing the inner pressure of said chamber through a valve; and a gas feeding means by which gas is supplied at desired pressure through a valve into said chamber.

4. A granular raw material feeder of claim 2:

wherein a granular raw material storage facility is connected to said granular raw material supply section through direct piping.

5. A granular raw material feeder of claim 3:

wherein a granular raw material storage facility is connected to said granular raw material supply section through direct piping.

6. A granular raw material feeder of claim 2:

wherein a granular raw material manufacturing facility is connected to said granular raw material supply section through direct piping.

7. A granular raw material feeder of claim 3:

wherein a granular raw material manufacturing facility is connected to said granular raw material supply section through direct piping.

* * * * *